United States Patent
Nunogaki

(10) Patent No.: US 10,418,220 B2
(45) Date of Patent: Sep. 17, 2019

(54) METALLIC ION SOURCE

(71) Applicant: ION LAB Co., Ltd., Ashiya-shi, Hyogo (JP)

(72) Inventor: Masanobu Nunogaki, Ashiya (JP)

(73) Assignee: ION LAB Co., Ltd., Ashiya-shi, Hyogo (JP)

( * ) Notice: Subject to any disclaimer, the term of this patent is extended or adjusted under 35 U.S.C. 154(b) by 0 days.

(21) Appl. No.: 16/313,051

(22) PCT Filed: Nov. 30, 2017

(86) PCT No.: PCT/JP2017/043097
§ 371 (c)(1),
(2) Date: Dec. 24, 2018

(87) PCT Pub. No.: WO2018/135153
PCT Pub. Date: Jul. 26, 2018

(65) Prior Publication Data
US 2019/0198281 A1    Jun. 27, 2019

(30) Foreign Application Priority Data

Jan. 17, 2017  (JP) .................................. 2017-005495

(51) Int. Cl.
| | | |
|---|---|---|
| *H01J 7/08* | (2006.01) | |
| *H01J 27/04* | (2006.01) | |
| *H01J 27/08* | (2006.01) | |
| *H01J 27/16* | (2006.01) | |
| *H01J 27/22* | (2006.01) | |
| *H01J 37/08* | (2006.01) | |

(52) U.S. Cl.
CPC .............. *H01J 27/22* (2013.01); *H01J 27/04* (2013.01); *H01J 27/08* (2013.01); *H01J 27/16* (2013.01); *H01J 37/08* (2013.01)

(58) Field of Classification Search
None
See application file for complete search history.

(56) References Cited

U.S. PATENT DOCUMENTS 8,759,788 B1 *   6/2014   Bassom ................... H01J 37/08
                                                                    250/423 R
2006/0177599 A1 * 8/2006 Madocks ................ C23C 14/32
                                                                    427/569

* cited by examiner

*Primary Examiner* — Dedei K Hammond
(74) *Attorney, Agent, or Firm* — James Judge

(57) ABSTRACT

Metallic ion source for resolving the issue of not being able to produce high-density ions efficiently with small-scale ion sources in situations where an electron beam injecting scheme is employed as the evaporation source to evaporate a solid, and for producing high-density ions highly efficiently. Designed to be compact and lightweight, the metallic ion source also facilitates selection of the ion extraction direction. The ion source, structured exploiting the characteristic physical property that whether ionization takes place is dependent on the energy of the electron beam, is furnished with a dual evaporation-plasma chamber that inside the same chamber enables a high-speed electron beam, whose ionization efficiency is low, and low-speed electrons generated by electric discharge, whose ionization efficiency is high, to participate independently and simultaneously in, respectively, evaporation of precursor and ionization action.

8 Claims, 8 Drawing Sheets

⊖ → Low-speed electrons
● → High-speed electron beam
⊕ → Precursor ions
Ⓖ → Precursor gas

METALLIC ION SOURCE

TECHNICAL FIELD

The present invention relates to metallic ion sources into which an electron beam is injected to evaporate metal, or other substance solid at ordinary room temperature, and ionize the generated precursor gas to produce and extract ions.

BACKGROUND ART

To date, applications in which ion sources have been employed include devices for implanting ions into semiconductor substrates, ion-beam etching devices, and thin-film coating devices for various components.

As evaporation sources for evaporating solids such as metals, heating schemes and electron beam injection schemes are known, and for the ionization of evaporation gases, a technique whereby electrons are collided with vaporized precursor gases to ionize the gases is known.

Among techniques that employ an electron beam injection scheme for the evaporation source, a precedent is disclosed in Patent Document 1, in which electron collision-ionization in a vapor from an electron beam injected on an evaporation region and from the secondary electrons therein gives rise to a plasma. Utilizing the electron beam injected on the evaporation region to give rise to the electric ionization action requires raising the gas pressure in the evaporation region and lowering the speed of the injecting electron beam to enlarge the cross-sectional area of the electron collisions. Therein, if its energy is set low the electron beam collides with the precursor gas on the path to the evaporation region, which degrades the efficiency of evaporation by the electron beam that arrives at the evaporation region. Meanwhile, a problem with setting the vacuum level low has been that it gives rise to electric discharge in the electron gun, such that the electron beam cannot form.

On account of the foregoing, an awareness that it is difficult to cause electrons for evaporation and electrons for ionization to act simultaneously in ambients of identical vacuum level has been held to date. Furthermore, an awareness that furnishing electric discharge electrodes in proximity to the evaporation source exerts an influence on the electric field for deflecting the electron beam introduced into the evaporation region, spoiling the directivity of the electron beam, has been held to date.

In order to resolve the above-described problems, the inventor involved with the present invention carried out discoveries with solid-state ion sources, disclosing them in Patent Document 2.

With the just-noted solid-state ion sources, the interspace between the precursor evaporation chamber and the plasma chamber is compartmentalized with a partitioning wall having a precursor-gas diffusion port for diffusing the vapor (precursor gas) into the plasma chamber, and at the same time an exhaustion port is provided on the electron beam generating section of the electron beam evaporator, making it so that even with the gas pressure in the precursor evaporation chamber growing high due to exhaustion being carried out, electric discharge in the electron beam generating section will not occur.

ANTECEDENT TECHNICAL LITERATURE

Patent Documents

Patent Document 1: Japanese Unexamined Pat. App. Pub. No. H04-306540

Patent Document 2: Japanese Pat. Pub. No. 4,440,304

SUMMARY OF INVENTION

Issues Invention is to Address

The fact that gases diffuse from a location where the gas pressure is high to a location where the vacuum level is high is understood to be ordinary technical knowledge.

With the precedent technology of Patent Document 2, in the first place, given that the interspace between the precursor evaporation chamber and the plasma chamber is compartmentalized with the partitioning wall having the precursor-gas diffusion port, providing exhaustion resistance, there is resistance to the introduction of precursor gas into the plasma chamber. A problem has been that, with the objective of raising the plasma density, raising the density of the precursor gas in the plasma chamber lowers the vacuum level in the electron beam generating section, giving rise to electric discharge, and halting the ion-source function.

In the second place, a problem has been that when the evaporation chamber and the plasma chamber are provided spaced apart, given the necessity, especially in situations where the evaporation source is a deflected electron beam injection system, of securing space in the evaporation chamber for the electron beam to deflect, devising the solid-state ion source apparatus overall to be compact and lightweight has proven difficult.

In the third place, given that precursor gases evaporating from a hearth (precursor dish) deployed on the floor portion of the plasma chamber interior to open its upper part and so that its evaporation surface will be horizontal diffuse while spreading out perpendicularly upward from the evaporation surface, in order to obtain an ion beam of high current density, in many cases the ion extraction port is provided in the upper portion and the ion-beam firing is directed upward, where the problem has been that the option of firing the ion beam in the horizontal direction is restricted.

Also, there has been no resolution concerning the issue, which the precedent technology set forth in Patent Document 1 has, that with it being difficult to efficiently cause electrons for evaporation and electrons for ionization to act simultaneously in ambients of identical vacuum level, high-density ions cannot be produced with high efficiency.

Consequently, in working toward making apparatuses for the generation of high-density ions at large volume—for example, thin-film formation devices for coating components of various kinds—practical, the development of evaporation sources for evaporating a solid in an electron beam injection system has been delayed.

An object of the present invention is to make available a metallic ion source that resolves the fundamental issue of not being able to generate high-density ions efficiently with a small-scale ion source in situations where an electron beam injection scheme is employed as the evaporation source for evaporating a solid, by exploiting the characteristic physical property that the level of electric ionization pronouncedly changes in accordance with the magnitude of the electron beam energy, and that at the same time serves to resolve issues apart from those given in the foregoing, to generate high-density ions at high efficiency. Also, a goal is to make available a metallic ion source that, as second objectives, serves to make metallic ion sources compact and lightweight, and facilitates selection of the ion extraction direction.

Means for Resolving the Issues

In order to resolve the above-described issues, a metallic ion source of the present invention—in metallic ion sources for extracting ions from a plasma obtained by injecting an energetic electron beam into a precursor inside a vacuum vessel to generate a precursor gas, and electrically ionizing the precursor gas by electric discharge—is provided with a dual evaporation-plasma chamber comprising an electron beam introduction port through which a high-speed electron beam injected onto a precursor is introduced chamber-interiorly, and discharge electrodes for producing a plasma; is provided with an electron beam evaporator comprising an electron beam generation chamber for generating a high-energy, high-speed electron beam, and a hearth opening upward in a bottom portion of the dual evaporation-plasma chamber, for evolving the precursor gas; and is characterized in that the discharge electrodes are deployed in positions determined in advance not to interfere with the high-speed electron beam's flight path.

The metallic ion source of the present invention is further characterized in an exhaustion resistance being furnished between the dual evaporation-plasma chamber and the electron beam generation chamber; and in comprising a differential exhaustion structure for, when the dual evaporation-plasma chamber interior is elevated by the precursor gas to a predetermined gas pressure, maintaining the vacuum level of the electron beam generation chamber at a high vacuum of not greater than $1 \times 10^{-2}$ Pa.

The metallic ion source of the present invention is further characterized in that any of PIG discharge, electron-collision arc discharge, arc discharge, or RF discharge electrodes is selectable for the discharge electrodes.

The metallic ion source of the present invention is further characterized in being provided with an ion extraction chamber, connected to the dual evaporation-plasma chamber; in an ion extraction port, through which diffused plasma is introduced into the ion extraction chamber, being provided in the dual evaporation-plasma chamber; in an ion extraction electrode system being furnished in the ion extraction chamber, adjacent to the ion extraction port; in an exhaustion resistance being furnished between the dual evaporation-plasma chamber and the ion extraction chamber; and in comprising a differential exhaustion structure for, when the dual evaporation-plasma chamber interior is elevated by the precursor gas to a predetermined gas pressure, maintaining the vacuum level at the ion extraction electrode system at a high vacuum of not greater than $1 \times 10^{-2}$ Pa.

Effects of Invention

According to a metallic ion source of the present invention, by exploiting the characteristic physical property that the level of electric ionization pronouncedly changes in accordance with the magnitude of the electron beam energy and, inside the same chamber, causing a high-speed electron beam, whose ionization efficiency is low, and low-speed electrons generated by electric discharge, whose ionization efficiency is high, to participate independently and simultaneously in, respectively, evaporation of precursor and ionization action, an effect of being able to generate high-density precursor ions is demonstrated.

Under an ambient in which the vacuum is lower than a prescribed vacuum level, the electrons generated by the electron beam generating section are discharged immediately post-generation and do not turn into a beam. According to a metallic ion source of the present invention, by comprising a differential exhaustion structure that maintains the vacuum level of the electron beam generation chamber in the electron beam evaporator at a high vacuum of $1 \times 10^{-2}$ Pa or less, the discharge of electrons immediately post-generation in the electron beam generating section is prevented, enabling the generation of a high-speed electron beam at high energy. Because the probability of the high-energy, high-speed electron beam colliding with the precursor gas generated from the hearth is low, due to the beam's characteristic physical property that its ionization level is extremely low, the effect of improving the efficiency of arriving at and heating the precursor is demonstrated.

Additionally, an object with the differential exhaustion structure is to make raising the gas pressure of the precursor gas inside the dual evaporation-plasma chamber possible, and to enable selecting various discharge types for the electric ionization.

Also, since an exhaustion resistance is furnished between the dual evaporation-plasma chamber and the electron beam generation chamber, the precursor gas from the solid, as well as the plasma, in the dual evaporation-plasma chamber may be controlled from diffusing into the electron beam generation chamber. This demonstrates the effect of allowing the vacuum level of the electron beam generation chamber to be maintained at a high vacuum of $1 \times 10^{-2}$ Pa or less, so that the electron beam may fire stably.

According to a metallic ion source of the present invention, the effect of being able to select the type of electric discharge in accordance with the precursor-gas density, which differs depending on the precursor, is demonstrated.

According to a metallic ion source of the present invention, by comprising a differential exhaustion structure that maintains the vacuum level at the ion extraction electrode system at a high vacuum of $1 \times 10^{-2}$ Pa or less, high-density ions can be extracted from the dual evaporation-plasma chamber, where the precursor gas pressure is high. At the same time, the effect of being able to control the precursor gas as well as the precursor plasma from diffusing into the electron beam generation chamber is demonstrated.

An additionally demonstrated effect is that the direction in which the high-density ions stream can be steered from the low-vacuum dual evaporation-plasma chamber toward the high-vacuum ion extraction chamber, enabling choice in extraction direction.

MODES FOR EMBODYING INVENTION

Figure 1:
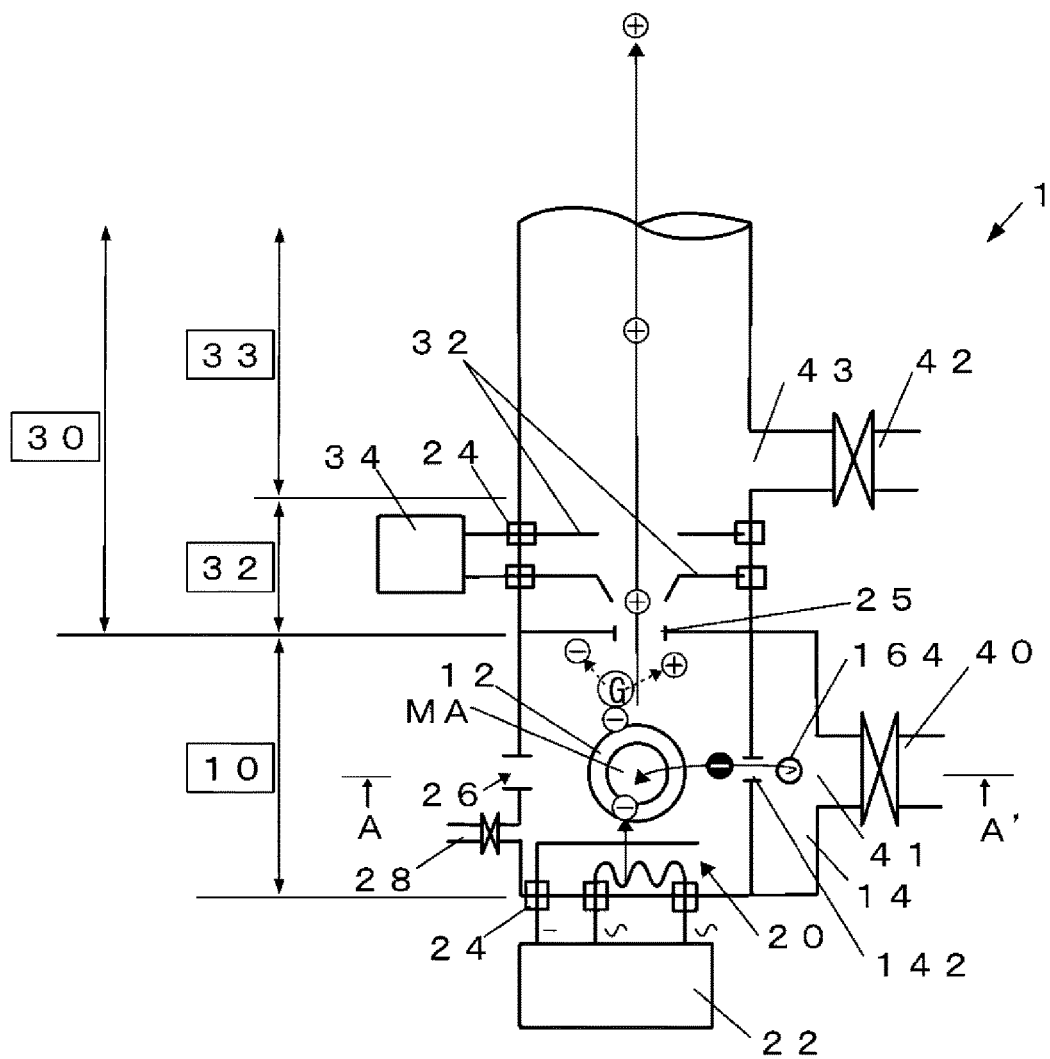
FIG. 1 is a plan-orientation sectional diagram of a metallic ion source 1 example apparatus involving the present invention.
Figure 2:
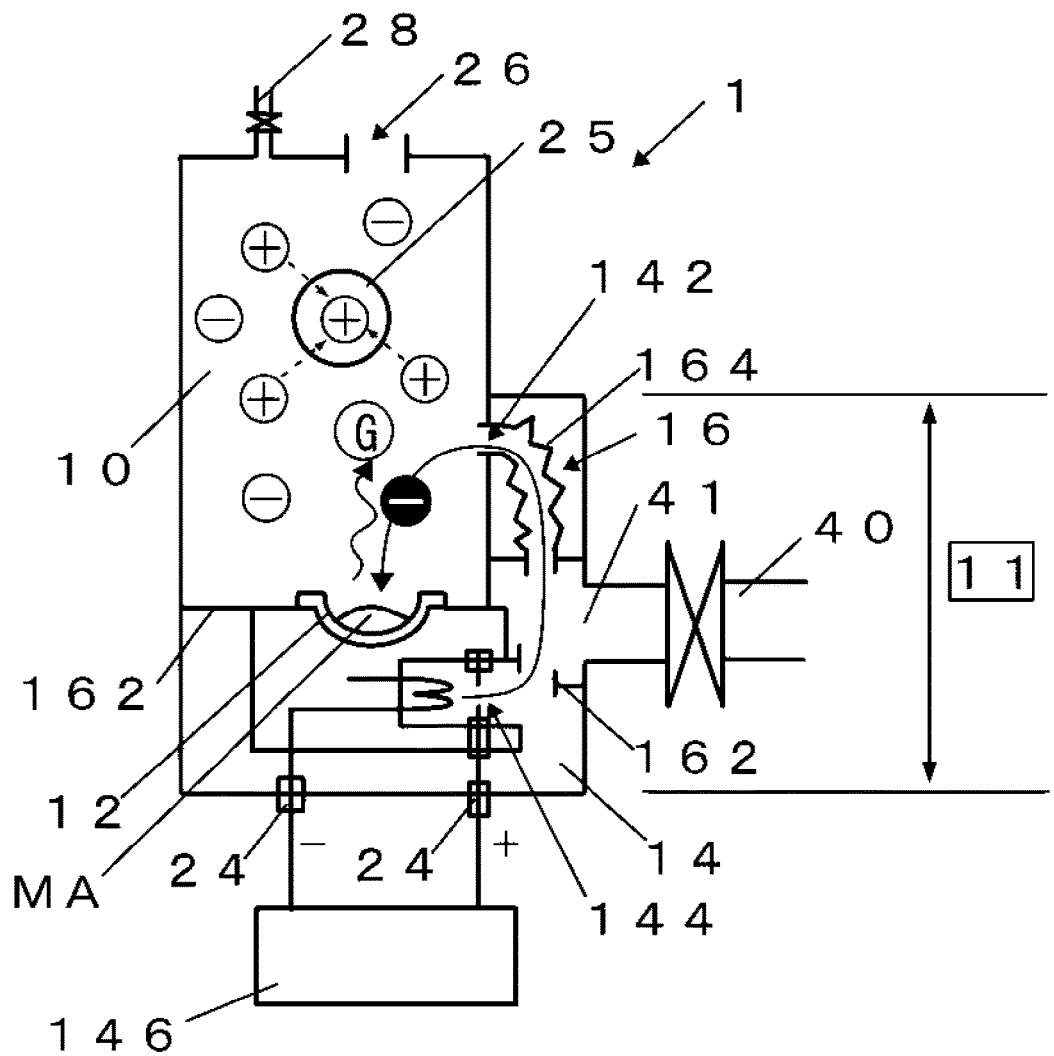
FIG. 2 is a sectional diagram along A-A' in FIG. 1, the metallic ion source 1 example apparatus involving the present invention.

While referring to the drawings, an explanation of a metallic ion source 1 involving the present invention will be made. FIG. 1 is a plan-orientation sectional diagram of a metallic ion source 1 apparatus involving the present invention. FIG. 2 is an A-A' sectional diagram of the metallic ion source 1 apparatus involving the present invention.

The metallic ion source 1 is composed of a dual evaporation-plasma chamber 10, an electron beam evaporator 11, and an ion extraction chamber 30. When the metallic ion source 1 is being operated, each is kept in a prescribed vacuum ambient.

The dual evaporation-plasma chamber 10 for generating ions is furnished with electric discharge electrodes 20. In the bottom portion of the dual evaporation-plasma chamber 10, a hearth 12 furnished in the upper surface of the electron beam evaporator 11 is deployed, opening upward. In FIG. 1 and FIG. 2, for the electron beam evaporator 11, a deflected electron beam injection system is exemplarily illustrated. Also, for the discharge electrodes 20, electron-collision arc discharge electrodes 204 (represented simply as discharge electrodes 20 in FIG. 1, FIG. 3, FIG. 4 and FIG. 8) are exemplarily illustrated and explained. An electron beam introduction port 142, and an ion extraction port 25 are additionally furnished in the dual evaporation-plasma chamber 10. Furnishing a gaseous-precursor gas supply port 28, and a plasma diffusion port 26 is also possible. The electron beam introduction port 142 is a feature opened on the dual evaporation-plasma chamber 10 in order to introduce a high-speed electron beam for heating the precursor. Through the ion extraction port 25, precursor ions from the plasma generated in the dual evaporation-plasma chamber 10 are sent out to the ion extraction chamber 30. Cases where the gaseous-precursor gas supply port 28 is provided enable introducing and ionizing a gas or an evaporated solid-state precursor gas. Further, it is also utilized in cases where, in order to ease generation of plasma when a precursor whose vapor pressure is low is rendered a source plasma, a discharge-support gas is mixed into the dual evaporation-plasma chamber 10 to raise the gas pressure. Extracting precursor gas and plasma from the plasma diffusion port 26 makes it possible to carry out coating or like surface treatments on a processed object placed outside the plasma diffusion port 26.

The electron beam evaporator 11 is constituted from an electron beam generation chamber 14 and the hearth (precursor dish) 12, with the hearth 12 being deployed on the floor portion inside the dual evaporation-plasma chamber 10 so as to open upwardly. Further, the electron beam generation chamber 14 is composed of an electron beam generation section 144, an exhaustion port a 41, and an exhaustion resistance instrument 16.

The electron beam generation chamber 14 is deployed at the underside of the hearth 12, separated off from the dual evaporation-plasma chamber 10 by an exhaustion resistance plate 162 or like partitioning wall, with the space being connected with the dual evaporation-plasma chamber 10 via the electron beam introduction port 142 alone. Through an electron beam control panel 146 an acceleration voltage of on the order of at least 3 kV is applied to the electron beam generation section 144 to eject a high-speed electron beam.

The hearth 12, deployed opening upwardly on the floor portion inside the dual evaporation-plasma chamber 10, carries a solid-state precursor MA for heating with the high-speed electron beam, and evolves precursor gas under the action of the arriving high-speed electron beam. By rendering the hearth 12 in a mechanically replaceable structure, the precursor-ion generation efficiency can be improved. For example, one means is to carry a plurality of hearths 12 in a turret scheme on a turntable and through an external operation rotate the turntable to allow replacement, while an automated sample changer is also an option.

The exhaustion port a 41 is connected to a vacuum pump a 40. Performing a preliminary exhaustion and then carrying out the main exhaustion makes it possible to reach a prescribed vacuum level efficiently in a short period of time. With the electron beam generation section 144 being under an ambient whose vacuum is lower than the prescribed vacuum level, electric discharge takes place immediately post-generation, such that a beam is not formed. The vacuum pump a 40 is utilized to maintain the vacuum level of the electron beam generation chamber 14 at a high vacuum of $1 \times 10^{-2}$ Pa or less.

In the dual evaporation-plasma chamber 10, with the evaporated precursor gas diffusing while spreading perpendicularly upward, the gas pressure rises, such that diffusing of the precursor gas or the plasma into the electron beam generation chamber 14 via the electron beam introduction port 142 must be kept under control. The exhaustion resistance instrument 16 is formed in the high-speed electron beam's flight path by utilizing an exhaustion resistance path 164 as a bottlenecked section, as well as by providing an exhaustion resistance plate 162 between the dual evaporation-plasma chamber 10 and the electron beam generation chamber 14, making it possible to maintain the electron beam generation chamber 14 at low gas pressure. Hence, between it and the dual evaporation-plasma chamber 10, a differential exhaustion structure is formed.

The electric discharge electrodes 20 are arranged alongside the upper-side section and/or lateral-side section of the dual evaporation-plasma chamber 10. By means of a discharge-electrode control panel 22 furnished on the exterior of the dual evaporation-plasma chamber 10, via lead lines the voltage and current for the discharge electrodes 20 is controlled to generate electric discharge. Lead-line conduction into the dual evaporation-plasma chamber 10 interior is carried out via current introduction terminals 24 insulated from the components constituting the dual evaporation-plasma chamber 10. Electrical breakdown in the current introduction terminals 24 can be prevented reliably and at low cost by, for example, utilizing the current introduction terminals 24 disclosed in Japanese Pat. No. 5,964,494.

In the metallic ion source 1 of the present invention, the dual evaporation-plasma chamber 10 is rendered by, as represented in FIGS. 1 and 2, integrating the evaporation chamber and the plasma chamber that to date have been sectioned into separate compartments. This means that the discharge electrodes 20 approach the high-speed electron beam for evaporation, and depending on the circumstances, a risk that the high-speed electron beam comes into contact with and damages the discharge electrodes 20 will arise. In order to prevent contact with the high-speed electron beam, the discharge electrodes 20 are arranged in a location predetermined not to interfere with the flight path of the high-speed electron beam. For example, in FIG. 1, the electron-collision arc discharge electrodes 204 are arranged on the lateral-side section of the dual evaporation-plasma chamber 10 interior, situated along an axis perpendicular to the plane containing the locus where the high-speed electron beam is incident on the hearth 12. This way facilitates the thermal electrons' travelling horizontally.

Novel advantages therefore arise. To date, in implementations in which electron-collision arc discharge electrodes have been employed, they have been arranged on the upper-side section to accelerate-impel the thermal electrons perpendicularly, and the precursor ions have been extracted perpendicularly. The reason for this is been that in implementations where the evaporation chamber and the plasma chamber are made separate compartments, the precursor gas readily diffuses upward, and thus with there being a tendency for the high-density portion of the precursor gas to extend vertically, collisions with the thermal electrons in motion perpendicularly are likely to occur.

The present invention, however, in which the evaporation chamber and plasma chamber are integrated to provide the dual evaporation-plasma chamber 10, makes causing electric discharge possible nearby the portion of the precursor gas where, immediately after evaporating and having begun to diffuse, the density is high, in that if the electron-collision arc discharge electrodes 204 are arranged alongside the lateral-side section of the dual evaporation-plasma chamber 10 interior, the thermal electrons will accelerate running horizontally, whereby extracting the precursor ions horizontally is facilitated. Within the plasma, electric fields are neutralized nearby. For ease of understanding a state in which the plasma has been produced, in FIG. 3, a conceptual diagram in relation to the diffusion state and ionization of the precursor gas in the dual evaporation-plasma chamber 10 of the metallic ion source 1 involving the present invention is presented.

Accordingly, in the present embodying mode, as indicated in FIG. 1, the ion extraction port 25 is situated in the lateral-side section that opposes the electron-collision arc discharge electrodes 204. The ion extraction chamber 30 is arranged connected to the lateral-side section where the ion extraction port 25 is situated. The ion extraction chamber 30 is equipped with an ion extraction electrode system 32, an exhaustion port b 43, and an ion drift section 33.

The ion extraction electrode system 32 suitably combines a variety of electrodes, including anodes and cathodes, to inductively guide the precursor ions generated in the dual evaporation-plasma chamber 10. The ion extraction electrode system 32 is connected via lead lines to an ion extraction electrode control panel 34 furnished on the ion extraction chamber 30 exterior, and by means of the ion extraction electrode control panel 34, the voltage necessary to carry out extraction of precursor ions is maintained. For the ion extraction electrode system 32, a commonly known ion extraction electrode system 32 can be utilized. In FIG. 1, FIG. 3, FIG. 4 and FIG. 8, the electrodes are truncated for the sake of convenience in order to illustrate the ion pathways and are connected to each other in the electrode direction stretching from the current introduction terminals 24. The lead lines introduced into the ion extraction chamber 30 are insulated from the constituent components of the ion extraction chamber 30 by the current introduction terminals 24. By, for example, utilizing the current introduction terminals 24 disclosed in Japanese Pat. No. 5,964,494, electrical breakdown in the current introduction terminals 24 can be prevented reliably and at low cost.

The exhaustion port b 43 is connected to a vacuum pump b 42. Performing a preliminary exhaustion and then carrying out the main exhaustion makes it possible to reach a prescribed vacuum level efficiently in a short period of time. By employing the vacuum pump b 42 to maintain the vacuum level of the ion extraction chamber 30 at a high vacuum of a high vacuum of $1\times10^{-2}$ Pa or less, a differential exhaustion structure is formed, making it possible to extract high-density ions from the dual evaporation-plasma chamber 10, where the precursor gas pressure is high.

In the ion drift section 33, neutral precursor gas, which has not electrically ionized or is from recombination, diffusing from the ion extraction electrode system 32 to the ion drift section 33 is adsorbed by a gas adsorption element (not illustrated) arranged in the ion drift section 33. The gas adsorption element is formed of, for example, a metal sheet that has been cooled with a cooling medium such as liquid nitrogen. By the neutral precursor gas being adsorbed on the gas adsorption element, the extracted ions can be injected as a beam securely into the surface of a processed object without any forming of a membrane of neutral precursor gas on the surface of the ion-processed object.

Figure 4:
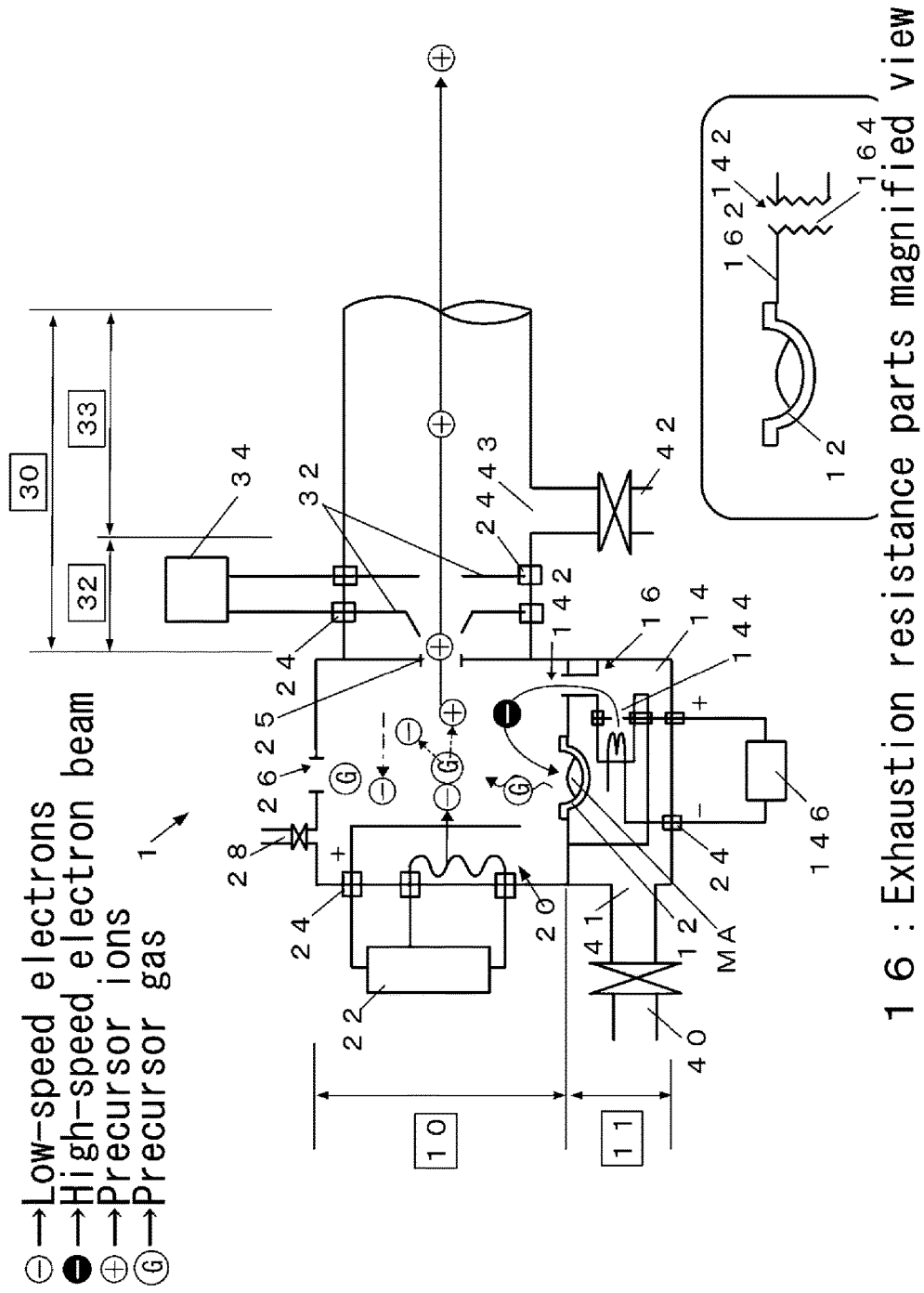
FIG. 4 is a diagram of principles of ion generation in the metallic ion source 1 involving the present invention.

FIG. 4 is a diagram of principles of ion generation in the metallic ion source 1 involving the present invention. Formation of the high-speed electron beam, its irradiation onto the precursor, generation of the precursor gas, electric discharge by the discharge electrodes 20, generation and acceleration/movement of the thermal electrons due to the electric discharge, ionization due to collision between the precursor gas and thermal electrons, and on up to extraction of precursor ions are represented schematized. For ease of understanding, distinct from FIG. 1, the discharge electrodes 20 are placed on the extension of a plane containing the locus where the high-speed electron beam is incident on the hearth 12.

A roughly 3 kV or greater acceleration voltage is applied by means of the electron beam control panel 146 to eject the high-speed electron beam. In order not to cause electric discharge in the electron beam generation section 144, it is necessary to maintain the vacuum level in the electron beam generation chamber 14 at a high vacuum of roughly $1\times10^{-2}$ Pa or less.

The high-speed electron beam ejected from the electron beam generation section 144 is deflected by means of the Lorentz force generated by a magnetic field formed by not-illustrated permanent magnets or the like, or by an electromagnetic field, and inductively guided to the hearth 12. En route the beam flies through the exhaustion resistance instrument 16 interior (cf. the exhaustion resistance instrument magnified view in FIG. 4) provided with the bottleneck in order to constitute a differential exhaustion structure between the dual evaporation-plasma chamber 10 and the electron beam generation chamber 14, is introduced through the electron beam introduction port 142 into the dual evaporation-plasma chamber 10 with its high-energy and high-speed maintained as-is, and arrives at the hearth 12.

In the ion source of Patent Document 1, with the plasma being engendered by electron collision-ionization in the vapor from an electron beam injected on a hearth and from the secondary electrons therein, the efficiency of evaporation by the electron beam that arrives at the hearth degrades, yet in the present invention, the high-speed electron beam can be made to function exclusively in heating the precursor to generate precursor gas. In the following this will be explained, utilizing the FIG. 5 graph.

Figure 5:
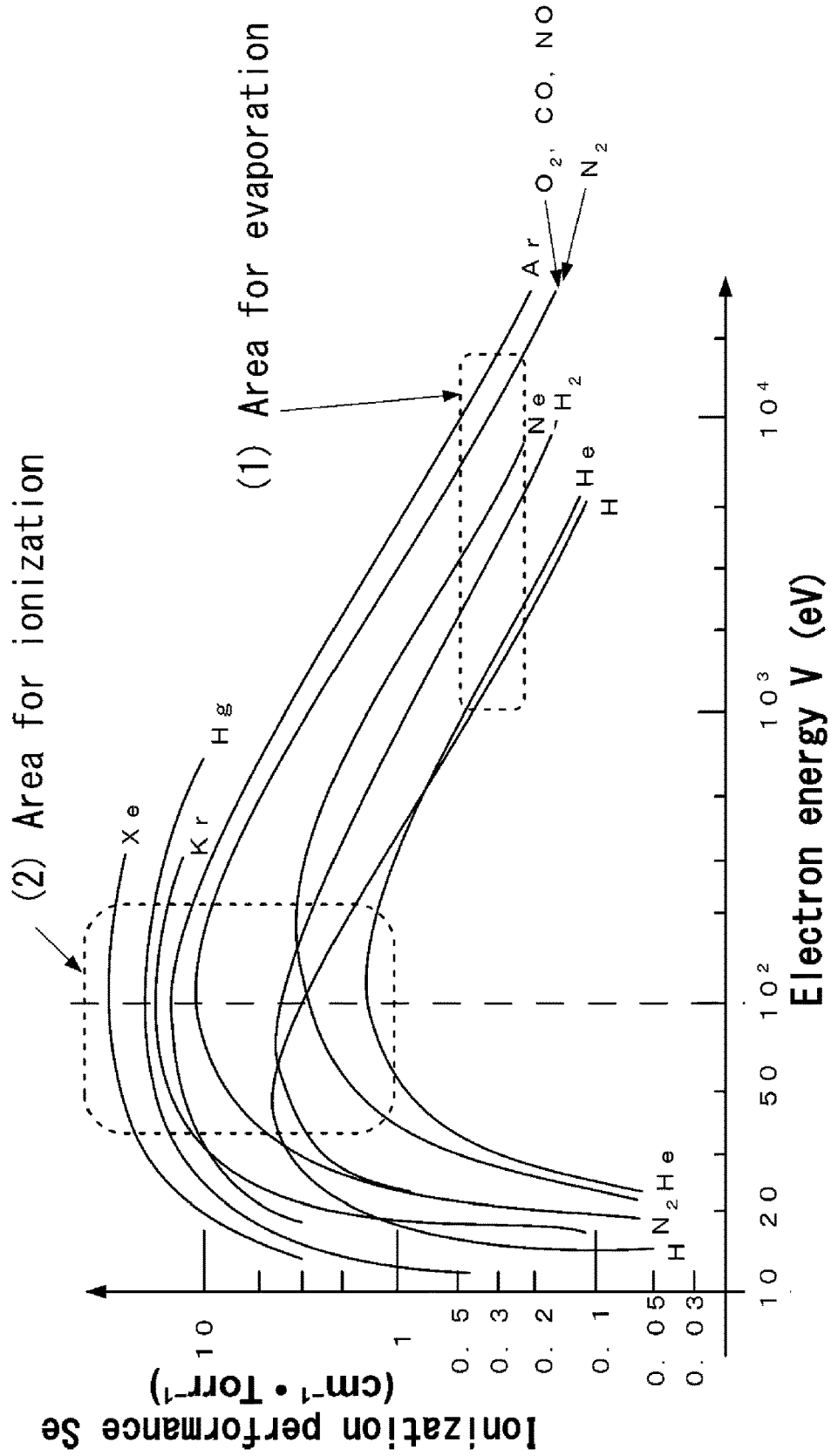
FIG. 5 is a graph plotting relationships between electron energy, and ionization performance proportionate to ionization total cross-sectional area.

FIG. 5 is a graph plotting relationships between electron energy, and ionization performance proportionate to ionization total cross-sectional area. From the graph it will be understood that for electrons having 1 k eV or greater energy, the ionization performance proportionate to ionization total cross-sectional area is an extraordinarily low under 0.5 $cm^{-1} \cdot Torr^{1}$. Accordingly, with a high-speed electron beam having an acceleration voltage set to 3 kV or greater, occurrence of the ionization action between it and the precursor gas decreases, enabling generation of precursor gas to be efficiently sustained.

Figure 3:
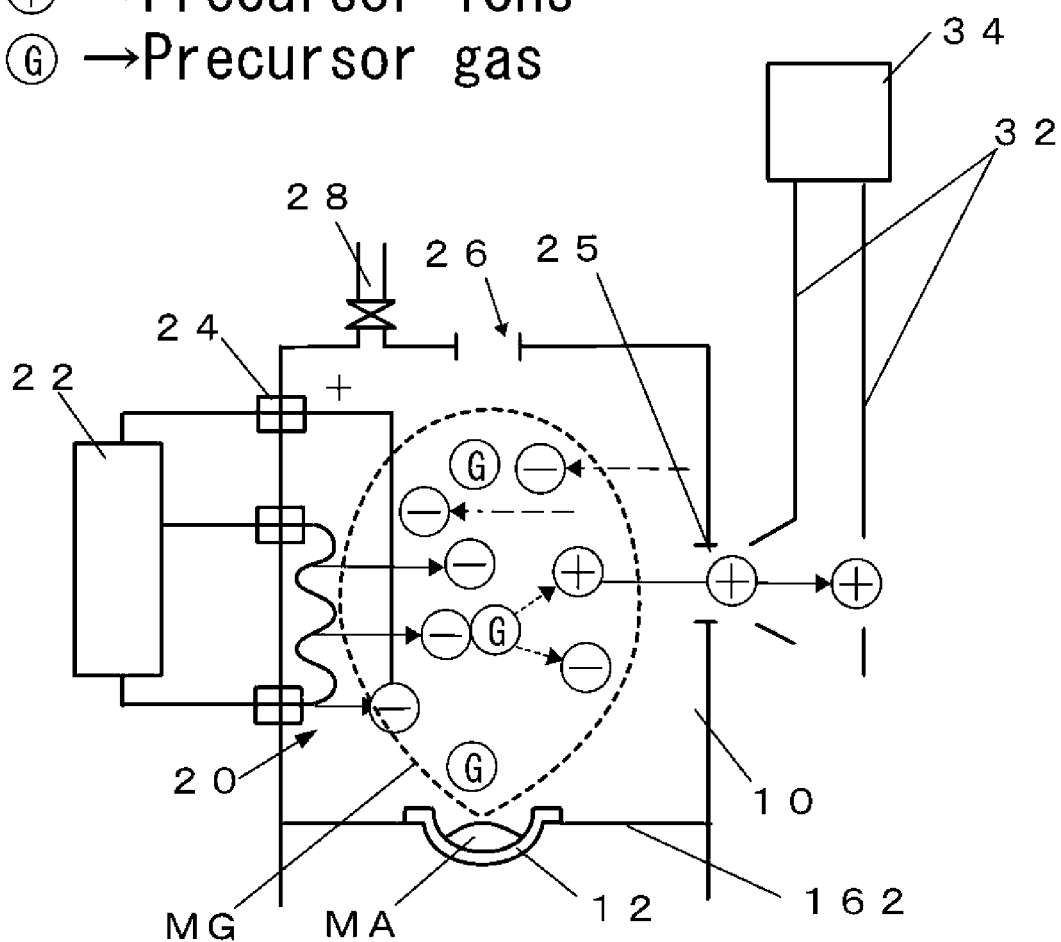
FIG. 3 is a conceptual diagram relating to the diffusion state and ionization of a precursor gas in a dual evaporation-plasma chamber 10 of the metallic ion source 1 involving the present invention.

The precursor loaded onto the hearth 12 is evaporated by the arriving high-speed electron beam, and the generated precursor gas diffuses while spreading perpendicularly upward (FIG. 3). For the precursor carried by the hearth 12, in addition to electroconductive substances such as titanium, silicon, boron, carbon, magnesium, aluminum, vanadium, chrome, iron, cobalt, nickel, copper, zinc, gallium, germanium, niobium, molybdenum, palladium, silver, indium, tin, tantalum, tungsten, rhenium, iridium, platinum, gold, mercury, lead, bismuth, thallium, nickel-chrome, steel-chrome, steel-nickel-chrome, and platinum-indium, evaporating other alloys is also possible.

The precursor gas generated by evaporation is ionized by colliding with electrons emitted from the discharge electrodes 20 disposed in proximity to the precursor gas diffusion area in the dual evaporation-plasma chamber 10 interior (FIG. 3). This means that electrons evolved from the precursor by ionization thereafter collide with the precursor gas, adding to the ionization action. With the number of times electrons and precursor gas collide increasing exponentially, electric discharge occurs, and ionization and neutralization enter into a balanced state in which plasma is stably generated.

As given by the FIG. 5 graph, with electrons having an energy centering around 100 eV and its proximity, from several 10 eV or more to a 200 eV level, the ionization performance proportionate to ionization total cross-sectional area is 1 cm$^{-1}$·Torr$^{-1}$ or more, indicating that the efficiency is favorable. Accordingly, for the voltage applied by the discharge-electrode control panel 22 to the discharge electrodes 20, in a range of from several 10 V to a 200 V level, a stable discharge is generated and sustained.

Figure 6:
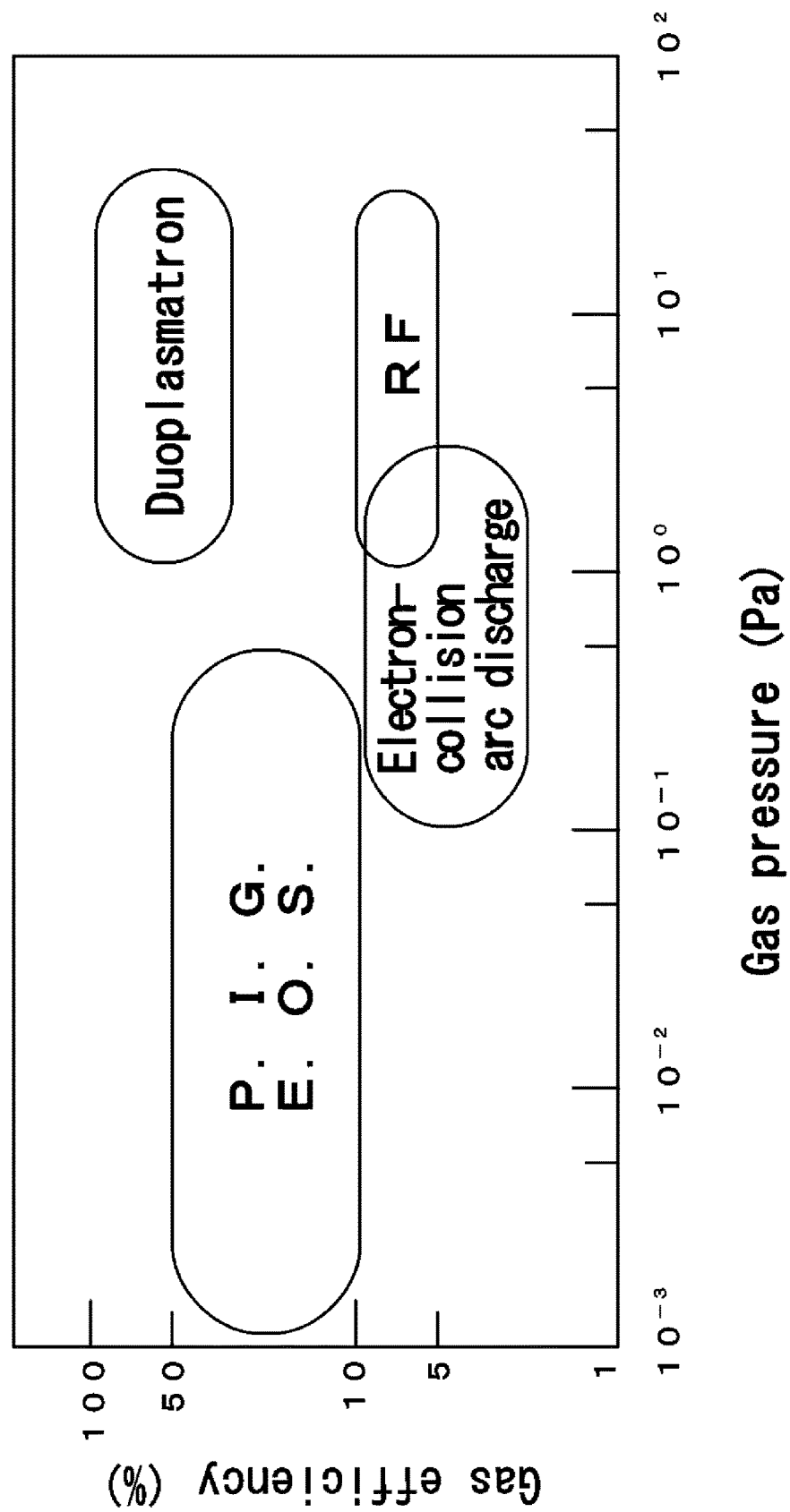
FIG. 6 is a graph indicating the degree of conformance between gas pressure inside a vacuum chamber for generating plasma, and electric discharge type.

FIG. 6 is a graph indicating the degree of conformance between gas pressure inside a vacuum chamber for generating plasma, and electric discharge type. Having the discharge electrodes 20 electrically discharge demands a dual evaporation-plasma chamber 10 internal gas pressure that is accorded with the discharge type. The dual evaporation-plasma chamber 10 interior prior to precursor gas generation is, by means of the vacuum pump a 40 and the vacuum pump b 42, in a high-vacuum state of the same $1 \times 10^{-2}$ Pa or less as the electron beam generation chamber 14 and the ion extraction chamber 30. When generation of the precursor gas under heating by the high-speed electron beam begins, the gas pressure inside the dual evaporation-plasma chamber 10 elevates, reaching the discharge-enabling gas pressure. In an implementation, for example, in which the electron-collision arc discharge electrodes 204 are selected as the discharge electrodes 20, from the FIG. 6 graph it will be understood that the gas pressure must reach $1 \times 10^{-1}$ Pa or more to a level of several Pa or less.

With the solid-state ion source in Patent Document 2, since the evaporation chamber and the plasma chamber are separated to provide an exhaustion resistance, raising the source-gas pressure inside the plasma chamber $1 \times 10^{-1}$ Pa or more up to a level of several Pa or less was not a simple matter. For that reason, the ion source is designed to employ a PIG-electrode means that enables electric discharge at a gas pressure of $1 \times 10^{-3}$ Pa or more to a level of $1 \times 10^{-1}$ Pa.

With a metallic ion source 1 involving the present invention, integrating the evaporation chamber and the plasma chamber to render the dual evaporation-plasma chamber 10 enables direct electric discharging in the area of high-density where the evaporated precursor gas diffuses while spreading perpendicularly upward—that is, the area where the gas pressure is high. What is more, the necessity to secure space for flight of the introduced electron beam toward the hearth 12, which had been a requirement in evaporation chambers to date, is eliminated, making it possible to scale down the dual evaporation-plasma chamber 10 to raise the precursor gas pressure to on the order of $1 \times 10^1$ Pa. In this way the electric discharge gas pressure may be controlled, making it possible to select whichever of the PIG discharge, electron-collision arc discharge, arc discharge, or RF discharge electrodes indicated in FIG. 6.

Figure 7:
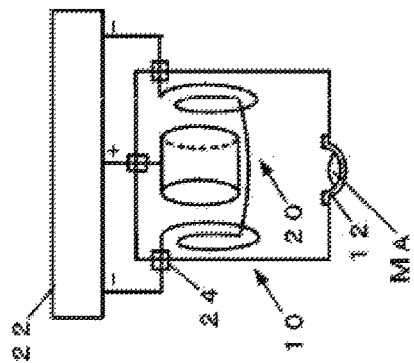
FIG. 7 is diagrams representing discharge electrode 20 examples and coordination examples usable in the metallic ion source 1 involving the present invention.
Figure 7:
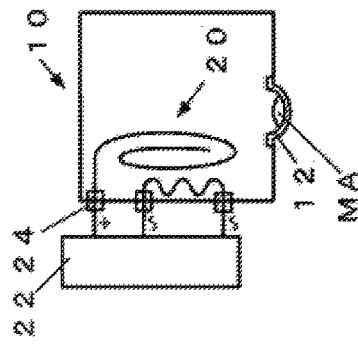
Figure 7:
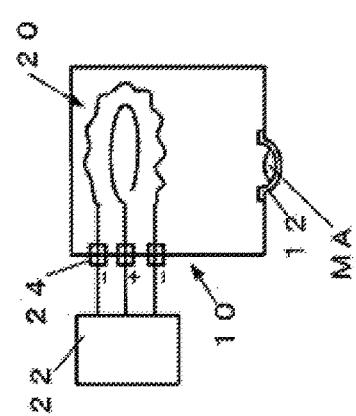
Figure 7:
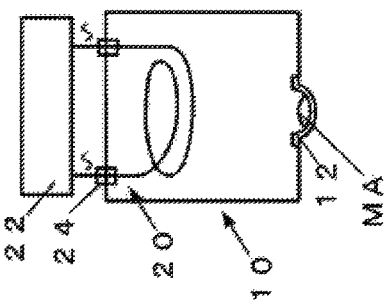

FIG. 7 is diagrams representing discharge electrode 20 examples and coordination examples usable in the metallic ion source 1 involving the present invention.

With PIG discharge, an anode in the form of a cylinder or shaped as a spiral is placed between a hot cathode and opposing anticathode, wherein the electrons are impelled axially. The electrons traveling nearby the anticathode are reflected by the retarding potential that the anticathode produces. In for example PIG discharge electrodes 202 made up of a hot cathode, an anticathode having a potential several 10 V higher than the hot cathode, and an anode having a potential several 10 V higher than the hot cathode, when the hot cathode is heated to emit thermal electrons, the thermal electrons move in tandem at high speed between the just-noted electrodes, wherein high-frequency discharge takes place. Since the electrons will reciprocate axially any number of times as long as there is no collision effect, electric discharge may be maintained even at a low pressure of $10^{-3}$ Pa (where the mean free path for ionization is long). Making the anticathode a ring structure enables extracting plasma from its external portion. If the cathodes and anode are disposed laterally as indicated in FIG. 7, the thermal electrons will move in tandem horizontally, facilitating extraction of precursor ions horizontally.

Electron-collision arc discharge is a discharge type in which electrons emitted from electron arc discharge electrodes are accelerated by the anode and inelastically collide with gaseous molecules, whereby their internal energy changes and the gaseous particles are collided/ionized.

Arc discharge is a discharge type whereby a portion of the material in arc discharge electrodes 206 evaporate, emitting thermal electrons. Sufficient thermal electrons are supplied from the high-temperature cathode, the discharge voltage is low, and the current density is large. Since the ions also participate in the ionization, the discharge-maintaining voltage is low, such that a high-density large-current discharge is yielded. Since the cathodes grow heated from experiencing ion collisions, cathodes of oxides of barium, strontium, calcium, etc. or cathodes of tungsten or tantalum are often employed.

RF discharge is a discharge type where a frequency at which the polarity of the voltage changes is applied to RF discharge electrodes 208 while ions have not arrived at the electrodes. Although the ions are trapped, with rapid speed the electrons flow into the electrodes in accordance with the different polarities. With plasma devices, which are best used in thin-film deposition and etching, it is a matter of placing high-RF power at a frequency of 13.56 MHz utilized in wireless communications or the like across two parallel flat plates. Because the source takes the form of a capacitor with the plasma being the dielectric it is called a capacitively coupled plasma (CCP). This is an electric field mode of discharge, which is an advantage in that although the density of the plasma is not all that high, conversion to larger calibers is easy. There is also the inductively coupled plasma (ICP) with a magnetic field mode of discharge, that is discharged by the magnetic field that an antenna current produces.

The essence of the metallic ion source 1 of the present invention is in exploiting the characteristic physical property that the level of electric ionization pronouncedly changes in accordance with the magnitude of the electron beam energy, and inside the same chamber, causing a high-speed electron beam, whose ionization efficiency is low, and low-speed electrons generated by electric discharge, whose ionization efficiency is high, to participate independently and simultaneously in, respectively, evaporation of precursor and ionization action, to generate high-density precursor ions.

To date, having the electric discharge electrodes co-dwell with the electron beam for evaporation has meant that the electromagnetic field that the discharge electrodes produce exerts an influence on the magnetic field that deflects the electron beam, hindering control. The inventor involved with the present invention, in a series of experiments, found the coordination conditions for the discharge electrodes 20 that while keeping the influence that the high-speed electron beam exerts on the ionization action under control, causes it to arrive at the hearth 12 and evaporate and gasify the precursor with high efficiency. And at the same time, the inventor realized that in cases where the discharge electrodes 20 for ionization are discharged under an ambient in which the density of the precursor gas is high, the fact that the mean free path is curtailed allows high-density precursor ions to be produced.

Implementation Example 1

Figure 8:
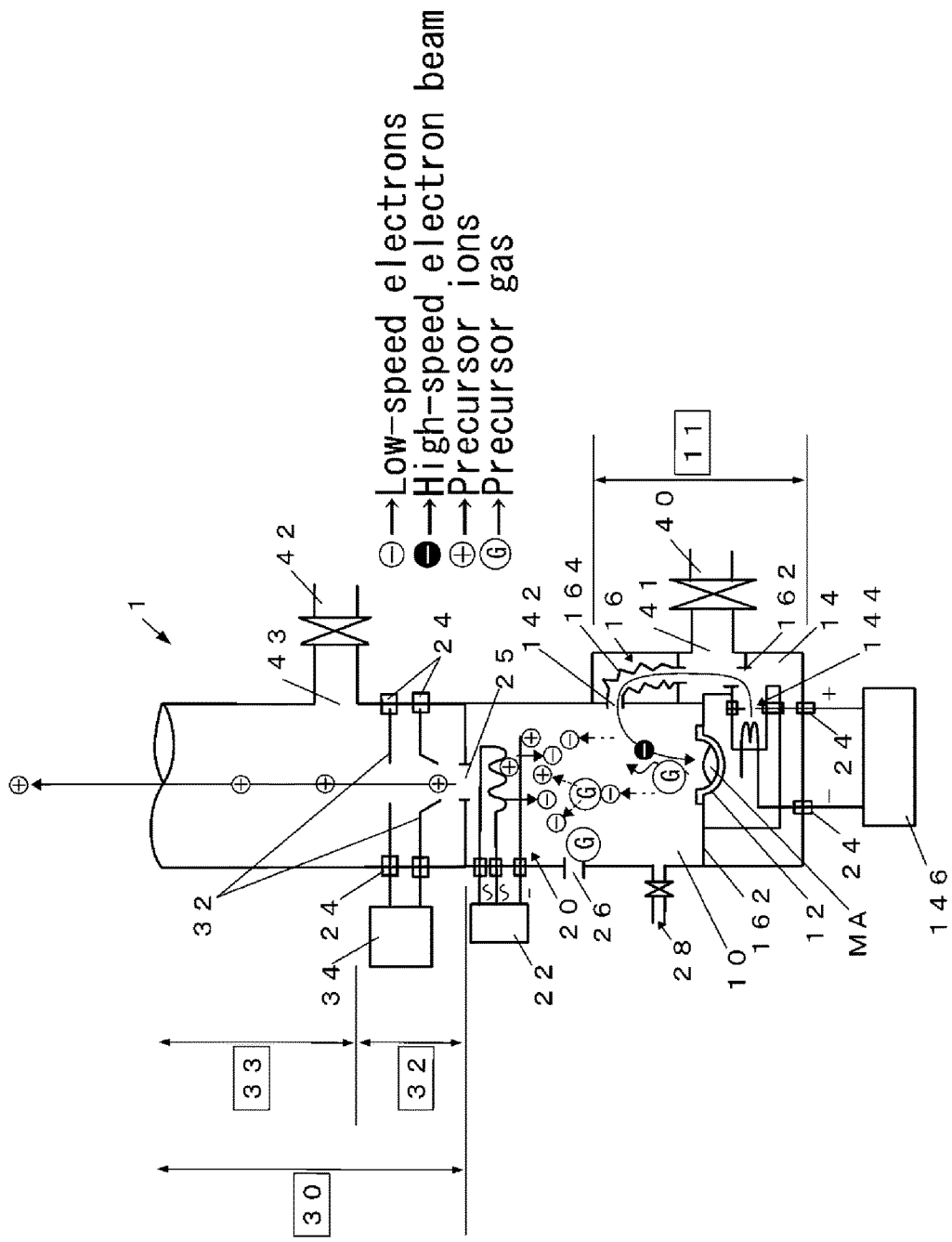
FIG. 8 is a sectional diagram in an elevational orientation, representing an implementation example provided with an ion extraction chamber 30, directed along a perpendicular.

FIG. 8 is a sectional diagram in an elevational orientation, representing an implementation example provided with an ion extraction chamber 30, directed along a perpendicular. In the embodying modes involving the present invention described up till now, particularly with the electron beam evaporator adopting a conventional deflected electron beam injection system, a mode in which a metallic ion source 1 for extracting precursor ions horizontally, which had never been facile, was illustrated as an example; however, the fact that modifying the FIG. 1 and FIG. 2 device examples of the metallic ion source 1 by providing an ion extraction port 25 in the upper-side section of the dual evaporation-plasma chamber 10 and connecting it with the ion extraction chamber 30, as indicated in FIG. 8, enables extraction of precursor ions perpendicularly upward follows naturally from the description set forth heretofore.

In the present specification, nothing in relation to ordinary technical knowledge that has been applied in ion sources to date is particularly set forth. Accordingly, the embodying modes and implementation example described thus far are only a portion of examples of metallic ion sources involving the present invention, and modification examples that can be arrived at by a person skilled in the art belong to the technical scope of the present invention.

Potential for Exploitation in Industry

Metallic ion sources involving the present invention are employed in ion implantation devices, ion beam etching devices, thin-film coating devices, and the like. They especially find effectual application in jobs implementing high-density, large-surface-area coatings onto cars, facilities, or apparatuses.

LEGEND

1: metallic ion source
10: dual evaporation-plasma chamber
11: electron beam evaporator
12: hearth
14: electron beam generation chamber
142: electron beam introduction port
144: electron beam generation section
146: electron beam control panel
16: exhaustion resistance instrument
162: exhaustion resistance plate
164: exhaustion resistance path
20: electric discharge electrodes
202: PIG discharge electrodes
204: electron-collision arc discharge electrodes
206: arc discharge electrodes
208: RF discharge electrodes
22: discharge-electrode control panel
24: current introduction terminals
25: ion extraction port
26: plasma diffusion port
28: gaseous-precursor gas supply port
30: ion extraction chamber
32: ion extraction electrode system
33: ion drift section
34: ion extraction electrode control panel
40: vacuum pump a
41: exhaustion port a
42: vacuum pump b
43: exhaustion port b
MA: precursor
MG: diffusion state of precursor gas

The invention claimed is:

1. A metallic ion source for extracting ions from a plasma obtained by injecting an electron beam onto a precursor inside a vacuum vessel to generate a precursor gas, and electrically ionizing the precursor gas by electric discharge, the metallic ion source comprising:
    a dual evaporation-plasma chamber furnished with
        an electron beam introduction port through which a high-speed electron beam injected onto the precursor is introduced chamber-interiorly, and
        discharge electrodes for producing a plasma;
    an electron beam evaporator furnished with
        an electron beam generation chamber for generating a high-energy, high-speed electron beam, and
        a hearth opening upward in a bottom portion of the dual evaporation-plasma chamber, for evolving the precursor gas; wherein
    the discharge electrodes are deployed in positions determined in advance not to interfere with the high-speed electron beam's flight path.

2. The metallic ion source according to claim 1, further comprising:
    an exhaustion resistance between the dual evaporation-plasma chamber and the electron beam generation chamber; and
    a differential exhaustion structure for, when the dual evaporation-plasma chamber interior is elevated by the precursor gas to a predetermined gas pressure, maintaining the vacuum level of the electron beam generation chamber at a high vacuum of not greater than $1 \times 10^{-2}$ Pa.

3. The metallic ion source according to claim 2, wherein any of PIG discharge, electron-collision arc discharge, arc discharge, or RF discharge electrodes is selectable for the discharge electrodes.

4. The metallic ion source according to claim 3, further comprising:
    an ion extraction chamber, connected to the dual evaporation-plasma chamber;

an ion extraction port, through which diffused plasma is introduced into the ion extraction chamber, provided in the dual evaporation-plasma chamber;

an ion extraction electrode system provided in the ion extraction chamber, adjacent to the ion extraction port; and a differential exhaustion structure for, when the dual evaporation-plasma chamber interior is elevated by the precursor gas to a predetermined gas pressure, maintaining the vacuum level at the ion extraction electrode system at a high vacuum of not greater than $1 \times 10^{-2}$ Pa.

5. The metallic ion source according to claim 2, further comprising:

an ion extraction chamber, connected to the dual evaporation-plasma chamber;

an ion extraction port, through which diffused plasma is introduced into the ion extraction chamber, provided in the dual evaporation-plasma chamber;

an ion extraction electrode system provided in the ion extraction chamber, adjacent to the ion extraction port; and a differential exhaustion structure for, when the dual evaporation-plasma chamber interior is elevated by the precursor gas to a predetermined gas pressure, maintaining the vacuum level at the ion extraction electrode system at a high vacuum of not greater than $1 \times 10^{-2}$ Pa.

6. The metallic ion source according to claim 1, wherein any of PIG discharge, electron-collision arc discharge, arc discharge, or RF discharge electrodes is selectable for the discharge electrodes.

7. The metallic ion source according to claim 6, further comprising:

an ion extraction chamber, connected to the dual evaporation-plasma chamber;

an ion extraction port, through which diffused plasma is introduced into the ion extraction chamber, provided in the dual evaporation-plasma chamber;

an ion extraction electrode system provided in the ion extraction chamber, adjacent to the ion extraction port;

an exhaustion resistance between the dual evaporation-plasma chamber and the ion extraction chamber; and a differential exhaustion structure for, when the dual evaporation-plasma chamber interior is elevated by the precursor gas to a predetermined gas pressure, maintaining the vacuum level at the ion extraction electrode system at a high vacuum of not greater than $1 \times 10^{-2}$ Pa.

8. The metallic ion source according to claim 1, further comprising:

an ion extraction chamber, connected to the dual evaporation-plasma chamber;

an ion extraction port, through which diffused plasma is introduced into the ion extraction chamber, provided in the dual evaporation-plasma chamber;

an ion extraction electrode system provided in the ion extraction chamber, adjacent to the ion extraction port;

an exhaustion resistance between the dual evaporation-plasma chamber and the ion extraction chamber; and a differential exhaustion structure for, when the dual evaporation-plasma chamber interior is elevated by the precursor gas to a predetermined gas pressure, maintaining the vacuum level at the ion extraction electrode system at a high vacuum of not greater than $1 \times 10^{-2}$ Pa.

* * * * *